United States Patent [19]

Koichi et al.

[11] Patent Number: 4,885,466

[45] Date of Patent: Dec. 5, 1989

[54] CORONA WIRE CLEANING DEVICE UTILIZING A POSITION DETECTION SYSTEM

[75] Inventors: Yasushi Koichi, Yamato; Haruzi Mizuishi, Tokyo; Mutuko Funaki; Tetsuya Fujioka, both of Yokohama, all of Japan

[73] Assignee: Ricoh Company, Ltd., Tokyo, Japan

[21] Appl. No.: 248,102

[22] Filed: Sep. 23, 1988

[30] Foreign Application Priority Data

| | | | |
|---|---|---|---|
| Sep. 25, 1987 | [JP] | Japan | 62-240254 |
| Oct. 30, 1987 | [JP] | Japan | 62-275232 |
| Nov. 12, 1987 | [JP] | Japan | 62-286325 |
| Jul. 29, 1988 | [JP] | Japan | 63-189737 |

[51] Int. Cl.[4] ........ H01J 37/26

[52] U.S. Cl. ........ 250/324; 250/325; 250/326; 361/229; 361/230; 355/215; 346/159

[58] Field of Search ........ 250/324, 325, 326; 361/229, 230; 355/215; 346/159

[56] References Cited

U.S. PATENT DOCUMENTS

| | | | |
|---|---|---|---|
| 3,842,273 | 10/1974 | Van Buskirk | 361/230 |
| 3,870,883 | 3/1975 | Oagley | 361/230 |
| 3,875,407 | 4/1975 | Hayne | 361/230 |
| 3,891,846 | 8/1975 | Ito | 361/230 |
| 3,953,772 | 4/1976 | Zimmer | 250/324 |
| 3,978,379 | 8/1976 | Del Vecchio | 361/230 |
| 4,019,055 | 4/1977 | Derleth | 250/324 |
| 4,038,546 | 7/1977 | Jasinski | 250/324 |
| 4,073,587 | 2/1978 | Selwyn | 355/215 |
| 4,265,998 | 5/1981 | Barkley | 250/325 |
| 4,516,848 | 5/1985 | Moriya | 250/324 |
| 4,680,669 | 7/1987 | Tsuchiya et al. | 250/324 |
| 4,746,796 | 5/1988 | Heigl | 250/324 |
| 4,788,573 | 11/1988 | Nakaoka et al. | 355/215 |

*Primary Examiner*—Carolyn E. Fields
*Assistant Examiner*—John A. Miller
*Attorney, Agent, or Firm*—Oblon, Spivak, McClelland, Maier & Neustadt

[57] ABSTRACT

A wire cleaning device has a cleaner movable for cleaning a charging wire in a corona discharger, and a motor for moving the cleaner. Whether or not the cleaner is locked somewhat in its stroke of movement is determined by signals from a position detector and a movement failure detector, or signals from an overcurrent detector and a timer. Alternatively, the cleaner which is locked in its moving stroke is forcibly moved by a larger amount of energy than normal, or is vibrated, on the basis of signals from a home position sensor and a failure detector.

4 Claims, 13 Drawing Sheets

CORONA WIRE CLEANING DEVICE UTILIZING A POSITION DETECTION SYSTEM

BACKGROUND OF THE INVENTION

1. Field of the Invention

The present invention relates to a wire cleaning device for cleaning a charging wire in a corona discharger used in a copying machine, a facsimile transmitter/-receiver, a printer, or the like.

2. Prior Art

Corona dischargers for use in electrophotographic copying machines or the like have corona charging wires. If the corona charging wire is smeared or dirty, then a corona discharge generated thereby becomes irregular. Where a corona discharger is employed as a charge unit in an image forming device in a copying machine or the like, a corona discharge irregularity causes a charging irregularity which results in a white line on a copied image. In case a corona discharger is used as an image transfer unit in an image forming device, a corona discharge irregularity produces an image transfer failure (appearing as a white patch). Where a corona discharger is employed as a sheet separator in an image forming device, a corona discharge irregularity tends to cause a recording sheet separation failure. To prevent these problems from occurring, it is current practice to employ a wire cleaning device for cleaning a charging wire in a corona discharger. The wire cleaning device includes a cleaning means such as a pad or the like which is reciprocally moved by a motor to clean the charging wire. The cleaning means moves from a home position at one end of the charging wire to the other end thereof. When the cleaning means engages a stopper at the other end of the charging wire, an overcurrent flows through the motor. When the cleaning means moves back to the home position and is stopped there, an overcurrent flows again through the motor. By detecting such an overcurrent flowing through the motor, it can be detected that the cleaning means has moved from the home position to the other end of the charging wire for reversing the motor, and also that the cleaning means has returned from the other end of the charging wire to the home position for deenergizing the motor. One cycle of cleaning operation is finished upon completion of one reciprocating movement of the cleaning means.

Since fine particles called toner are employed in the image developing unit in the image forming device, the cleaning means is smeared with more toner and more load is imposed on the cleaning means as it is used in more cleaning cycles. Toner scattered from the image developing unit may be deposited o the charging wire to the point where the load on the cleaning means will stop the cleaning means during a cleaning process. When this happens, the motor is heated to break the charging wire, resulting in an improperly reproduced image or a sheet jam. The movement of the cleaning means from the home position to the other end of the charging wire and back is detected by an overcurrent flowing through the motor, as described above. Even if the cleaning means is locked for some reason somewhere between the home position and the other end of the charging wire, an overcurrent flows through the motor, detecting as if the cleaning means reached the home position or the other end of the charging wire. Therefore, with the cleaning means locked between the home position and the other end of the charging wire, a copying process is effected by the copying machine to reproduce an image which is defective due to a white patch or line. One solution would be to employ a sensor for detecting unwanted stoppage of the cleaning means between the home position and the other end of the charging wire, indicate a failure, inactivate the copying machine, and energize a serviceman call indicator. This solution is however also disadvantageous in that even when the cleaning means is stopped somewhere in its moving stroke due to a small amount of smear on the cleaning means, the copying machine is shut down and no image can be produced until the cleaning means is repaired by a serviceman. Therefore, the efficiency of forming images in the image forming device is poor.

SUMMARY OF THE INVENTION

In view of the aforesaid drawbacks of the conventional wire cleaning devices, it is an object of the present invention to provide a wire cleaning device which is capable of preventing the reproduction of an improper image which would otherwise be produced by the locking of a cleaning means somewhere in its moving stroke, and also of automatically canceling unwanted stoppage of the cleaning means somewhere in its moving stroke due to a small amount of smear thereon, for thereby preventing the reproduction of an improper image or the occurrence of a sheet jam which would otherwise be caused by such unwanted stoppage of the cleaning means, and also preventing the efficiency of image forming operation in an image forming device.

According to the present invention, there is provided a wire cleaning device comprising cleaning means movable for cleaning a charging wire in a corona discharger, a motor for moving the cleaning means, position detecting means for detecting the position of the cleaning means, failure detecting means for detecting a movement failure of the cleaning means, and lock determining means for determining whether the cleaning means is locked in a moving stroke thereof based on information detected by the failure detecting means and the position detecting means.

With the above arrangement, any improper or abnormal image which would otherwise be produced by the locking of the cleaning means somewhere in its moving stroke can be prevented from being formed.

According to the present invention, there is also provided a wire cleaning device comprising cleaning means movable for cleaning a charging wire in a corona discharger, a motor for moving the cleaning means, overcurrent detecting means for detecting an overcurrent flowing through the motor, timer means for starting to count time simultaneously with starting of movement of the cleaning means and lock determining means for determining whether the cleaning means is locked in a moving stroke thereof from the time counted by the timer means when an overcurrent is detected by the overcurrent detecting means.

With the above arrangement, any improper or abnormal image which would otherwise be produced by the locking of the cleaning means somewhere in its moving stroke can be prevented from being formed.

According to the present invention, there is further provided a wire cleaning device for use in an image forming device having a corona discharger for recording an image, comprising cleaning means for cleaning a charging wire in the corona discharger, a motor for moving the cleaning means, a sensor for detecting the cleaning means at each of opposite ends of the charging wire, failure detecting means responsive to a detected signal from the sensor for detecting stoppage of the cleaning means in a moving stroke thereof, and control means responsive to failure detection by the failure detecting means for applying a larger amount of energy than normal to the motor to forcibly move the cleaning means.

With the above arrangement, any improper or abnormal image which would otherwise be produced by the locking of the cleaning means somewhere in its moving stroke can be prevented from being formed. Moreover, unwanted stoppage or locking of the cleaning means somewhere in its moving stroke due to a small amount of smear or dirt thereon can automatically canceled, for thereby preventing the reproduction of an improper image or the occurrence of a sheet jam which would otherwise be caused by such unwanted stoppage of the cleaning means, and also preventing the efficiency of image forming operation in an image forming device.

According to the present invention, there is also provided a wire cleaning device comprising cleaning means movable for cleaning a charging wire in a corona discharger, a motor for moving the cleaning means, a home position sensor for detecting the cleaning means in a home position at one end of the charging wire, failure detecting means responsive to a detected signal from the home sensor for detecting a movement failure of the cleaning means, and vibration generating means responsive to failure detection by the failure detecting means for imparting vibration to the cleaning means.

With the above arrangement, any improper or abnormal image which would otherwise be produced by the locking of the cleaning means somewhere in its moving stroke can be prevented from being formed. Moreover, unwanted stoppage or locking of the cleaning means somewhere in its moving stroke due to a small amount of smear or dirt thereon can automatically canceled, for thereby preventing the reproduction of an improper image or the occurrence of a sheet jam which would otherwise be caused by such unwanted stoppage of the cleaning means, and also preventing the efficiency of image forming operation in an image forming device.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 1:
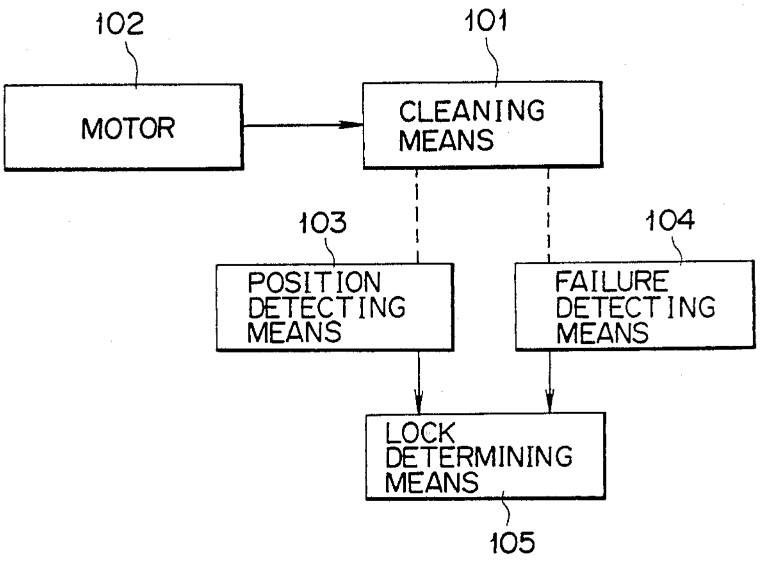
FIG. 1 is a block diagram of a wire cleaning device according to a first embodiment of the present invention.

As shown in FIG. 1, a wire cleaning device according to a first embodiment of the present invention includes a cleaning means 101 movable for cleaning a charging wire in a corona discharger, a motor 102 for moving the cleaning means 101, a position detecting means 103 for detecting the position of the cleaning means 101, a failure detecting means 104 for detecting a movement failure of the cleaning means 101, and a lock determining means 105 for determining whether the cleaning means 101 is locked in a moving stroke thereof based on information detected by the failure detecting means 104 and the position detecting means 103.

The cleaning means 101 is moved by the motor 102 to clean the charging wire in the corona discharger, and the position of the cleaning means 101 as it moves is detected by the position detecting means 103. A movement failure of the cleaning means 101 is detected by the failure detecting means 104. Whether the cleaning means 101 is locked in its moving stroke is determined by the lock determining means 105 based o information detected by the failure detecting means 104 and the position detecting means 103.

Figure 2:
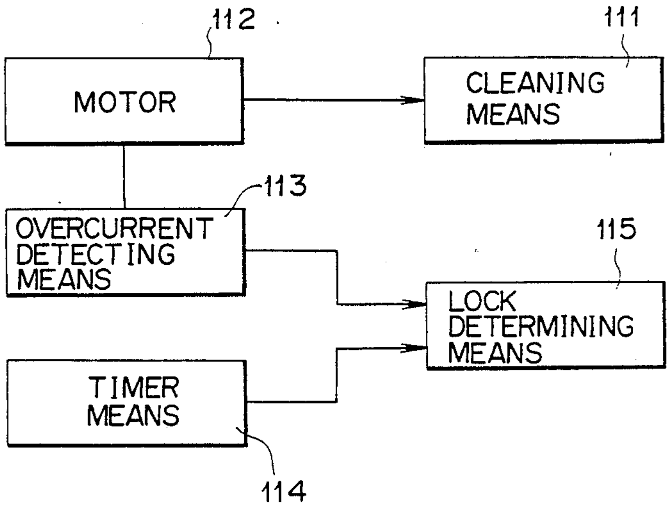
FIG. 2 is a block diagram of a wire cleaning device according to a second embodiment of the present invention.

As shown in FIG. 2, a wire cleaning device according to a second embodiment of the present invention includes a cleaning means 111 movable for cleaning a charging wire in a corona discharger, a motor 112 for moving the cleaning means 111, an overcurrent detecting means 113 for detecting an overcurrent flowing through the motor 112, a timer means 114 for starting to count time simultaneously with starting of movement of the cleaning means 111, and a lock determining means 115 for determining whether the cleaning means 111 is locked in a moving stroke thereof from the time counted by the timer means 114 when an overcurrent is detected by the overcurrent detecting means 113.

The cleaning means 111 is moved by the motor 112 to clean the charging wire in the corona discharger, and an overcurrent flowing through the motor 112 is detected by the overcurrent detecting means 13. At the same time that the cleaning means 111 starts moving, the timer means 114 starts counting time. Whether the cleaning means 111 is locked in its moving stroke is determined by the lock determining means 115 from the time counted by the timer means 114 when an overcurrent is detected by the overcurrent detecting means 113.

Figure 3:
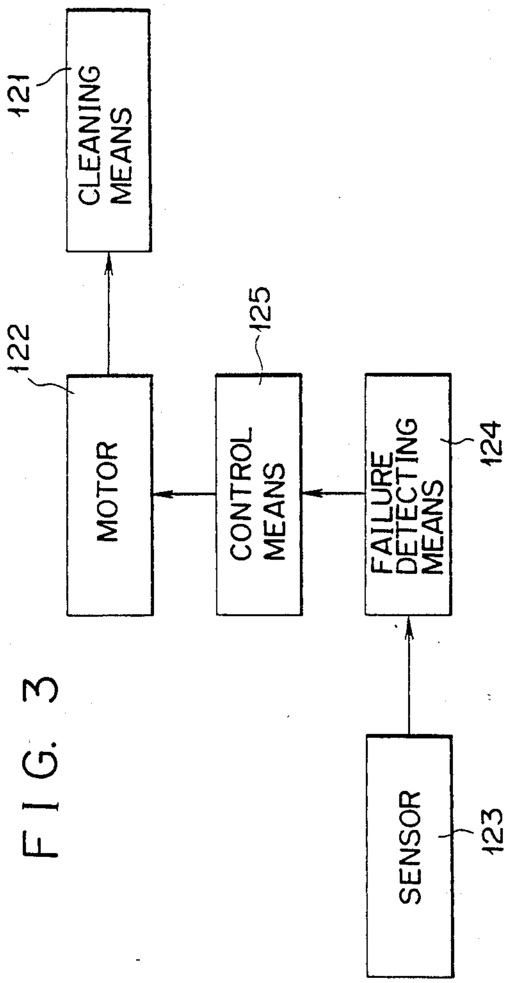
FIG. 3 is a block diagram of a wire cleaning device according to a third embodiment of the present invention.

As illustrated in FIG. 3, a wire cleaning device according to a third embodiment of the present invention, for use in an image forming device having a corona discharger for recording an image, includes a cleaning means 121 for cleaning a charging wire in the corona discharger, a motor 122 for moving the cleaning means 121, a sensor 123 for detecting the cleaning means 121 at each of opposite ends of the charging wire, a failure detecting means 124 responsive to a detected signal from the sensor 123 for detecting stoppage of the cleaning means 121 in a moving stroke thereof, and a control means 125 responsive to failure detection by the failure detecting means 124 for applying a larger amount of energy than normal to the motor 122 to forcibly move the cleaning means.

The cleaning means 121 is moved by the motor 122 to clean the charging wire in the corona discharger, and the cleaning means 121 at each of the opposite ends of the charging wire is detected by the sensor 123. The failure detecting means 124 detects stoppage of the cleaning means 121 in its moving stroke from a detected signal from the sensor 123. Upon failure detection by the failure detecting means 124, the control means 125 applies a larger amount of energy than normal to the motor 122 for forcibly moving the cleaning means 121.

Figure 4:
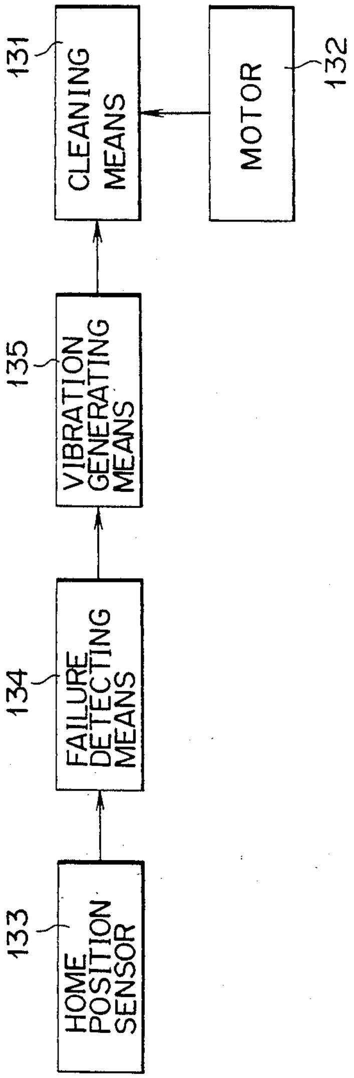
FIG. 4 is a block diagram of a wire cleaning device according to a fourth embodiment of the present invention.
Figure 5:
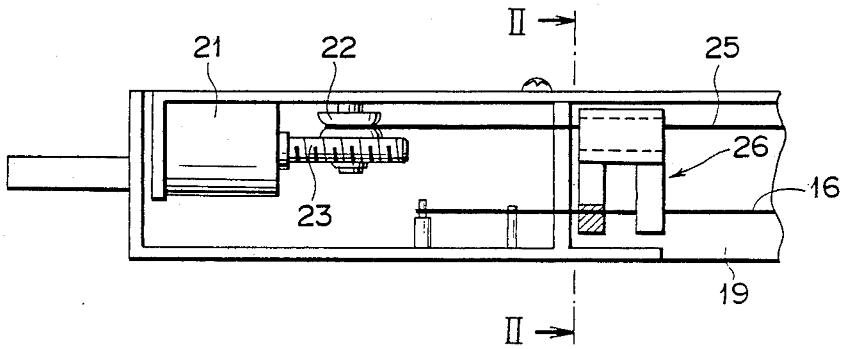
FIG. 5 is a fragmentary side elevational view of a mechanism of each of the wire cleaning devices according to the first and second embodiments.

As shown in FIG. 4, a wire cleaning device according to a fourth embodiment of the present invention includes a cleaning means 131 movable for cleaning a charging wire in a corona discharger, a motor 132 for moving the cleaning means 131, a home position sensor 133 for detecting the cleaning means 131 in a home position at one end of the charging wire, a failure detecting means 134 responsive to a detected signal from the home sensor 133 for detecting a movement failure of the cleaning means 131, and a vibration generating means 135 responsive to failure detection by the failure detecting means 134 for imparting vibration to the cleaning means 131.

The cleaning means 131 is moved by the motor 132 to clean the charging wire in the corona discharger, and the cleaning means 131 in the home position at on end of the charging wire is detected by the home position sensor 133. The failure detecting means 134 detects a movement failure of the cleaning means 131 from a detected signal from the home position sensor 133. In response to failure detection by the failure detecting means 134, the vibration generating means 135 imparts vibration to the cleaning means 131.

FIGS. 5 through 10 show a mechanism of each of the wire cleaning devices of the first and second embodiments of the present invention.

The wire cleaning device of FIGS. 5 through 10 is incorporated in a corona discharger for charging a photosensitive member, transferring an image from a photosensitive member, or erasing electric charges from a photosensitive member, in a copying machine or the like. The corona discharger includes a shield case comprising a pair of side plates 11, 12 with end blocks 13, 14 (FIG. 10) fixed to opposite ends thereof, and a back plate 15 (FIG. 6) fixed to the upper edges of the side plates 11, 12. Two parallel charging wires 16, 17 (FIGS. 8 and 10) are disposed in the shield case and have opposite ends fixed to the end blocks 13, 14. The corona discharger is positioned such that its lower opening 19 confronts a photosensitive member 18 (FIG. 6) in a copying machine or the like. A high voltage is applied to the charging wires 16, 17 by a driver circuit to generate a corona discharge for uniformly charging the photosensitive member 18 as it moves. Partitions 20 (FIG. 8) are disposed between the end blocks 13, 14 of the shield case, in the opening 19.

Figure 6:
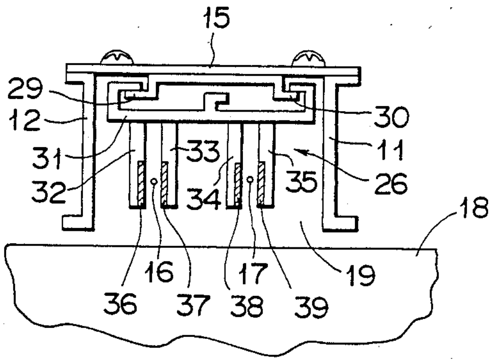
FIG. 6 is a cross-sectional view taken along line II—II of FIG. 5.
Figure 7:
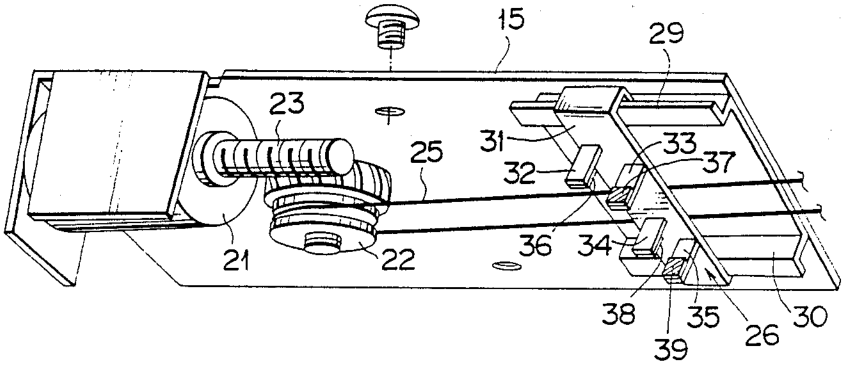
FIG. 7 is a perspective view of one end of a back plate of the mechanism shown in FIG. 5.
Figure 8:
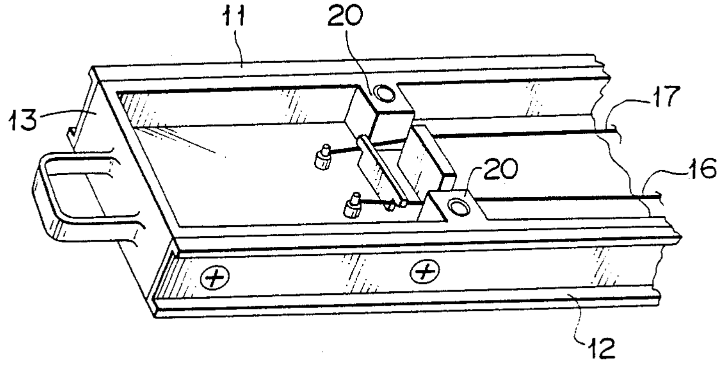
FIG. 8 is a fragmentary perspective view of an end block of the mechanism shown in FIG. 5.
Figure 9:
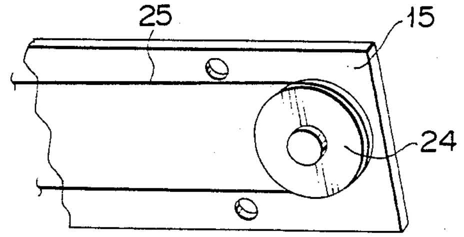
FIG. 9 is a fragmentary perspective view of the other end of the back plate of the mechanism of FIG. 5.
Figure 10:
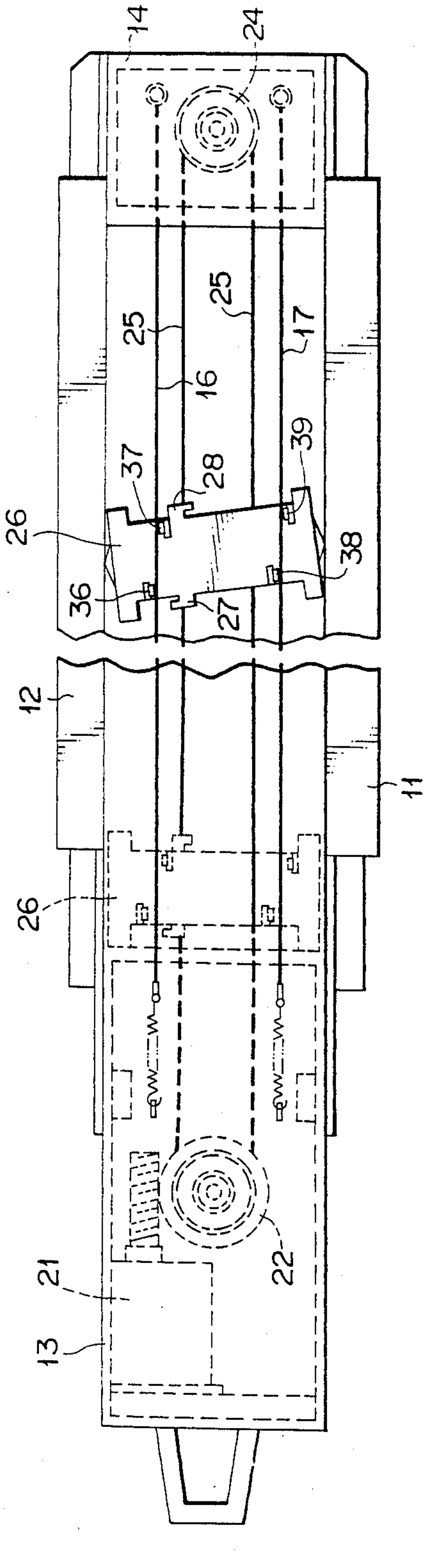
FIG. 10 is a fragmentary bottom view of the mechanism of FIG. 5.

The mechanism of the wire cleaning device is incorporated in the corona discharger. As shown in FIGS. 6 and 10, a motor 21 and a pulley 22 are mounted on the back plate 15 at one end thereof, the motor 21 being operatively coupled to the pulley 22 through a worm gear mechanism 23. Another pulley 24 (FIG. 10) is also mounted on the back plate 15 on the other end thereof. A wire 25 is trained around the pulleys 22, 24 and affixed to hooks 27, 28 of a cleaning means 26 (FIG. 10). A pair of rails 29, 30 (FIG. 6) is attached to the back plate 15 parallel to the charging wires 16, 17, the cleaning means 26 being guided by the rails 29, 30 for reciprocating movement. The cleaning means 6 comprises, as shown in FIGS. 6 and 7, a support base 31 engaging the rails 29, 30, and four upstanding legs 32, 33, 34, 35 mounted on the support base 31. The legs 32, 33, 34, 35 are grouped into two pairs positioned in sandwiching relation to the charging wires 16, 17. Cleaning pads 36, 37, 38, 39 are attached respectively to the legs 32, 33, 34, 35 at their surfaces facing the charging wires 16, 17. When not in use, the cleaning means 26 is placed in a home position near one end of the charging wires 16, 17 (on the lefthand side in FIG. 10) out of a charging area (the opening 19). In the home position, the cleaning means 26 is contacted by the partitions 20 so as to be oriented perpendicularly to the charging wires 16, 17 for thereby holding the cleaning pads 36, 37, 38, 39 out of contact with the charging wires 16, 17. When the motor 21 is energized, the pulley 22 is rotated by the worm gear mechanism 23 to move the wire 25 for displacing the cleaning means 26 from the home position toward the other end of the charging wires 16, 17. The cleaning means 26 is tilted with respect to the charging wires 16, 17 while moving along the rails 29, 30, during which time two of the cleaning pads 36, 37, 38, 39 slidingly engage the charging wires 16, 17 to clean the same. When the cleaning means 26 reaches the other end of the charging wires 16, 17 and abuts against the end block 14, the motor 21 is reversed to move the cleaning means 26 back to the home position while at the same time the cleaning means 26 cleans the charging wires 16, 17. In the returning stroke, the cleaning means 26 is tilted in the opposite direction to the direction in which is was tilted during movement toward the end block 14, and the other two of the cleaning pads 36, 37, 38, 39 slidingly engage the charging wires 16, 17 to clean the same. When the cleaning means 26 reaches the home position, the motor 21 is de-energized, and one cycle of cleaning of the charging wires 16, 17 is completed.

Figure 11:
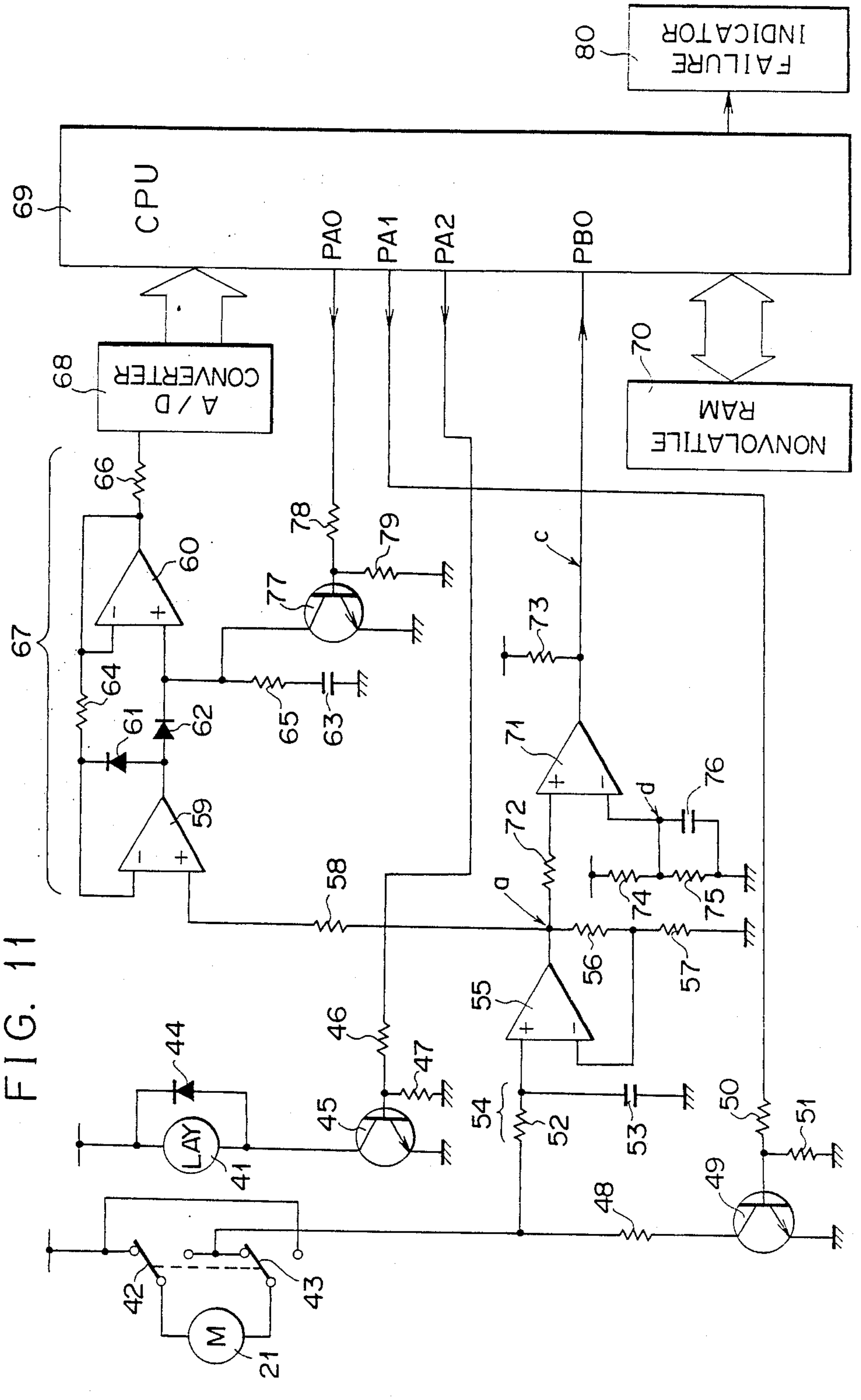
FIG. 11 is a circuit diagram of an electric circuit of each of the wire cleaning devices of the first and second embodiments.
Figure 12:
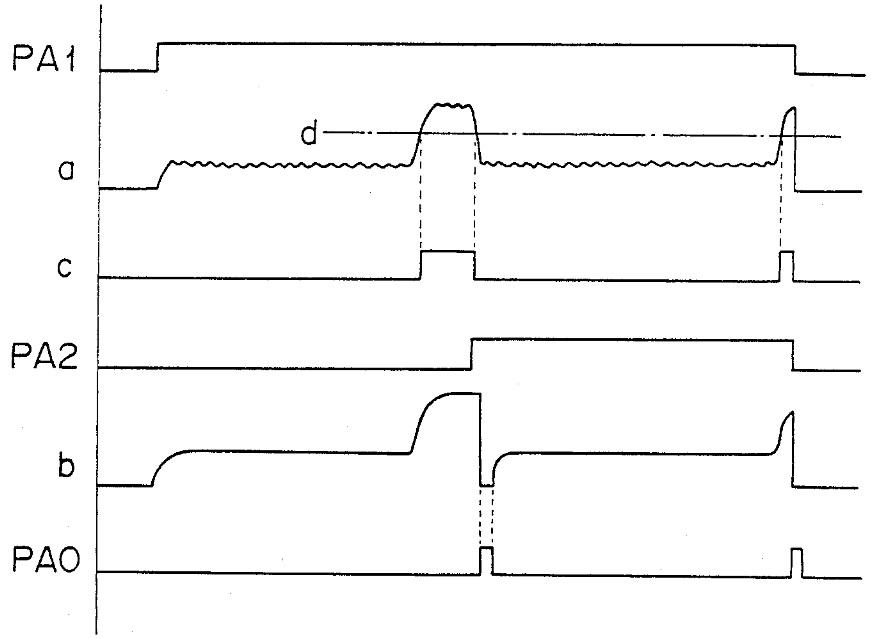
FIG. 12 is a timing chart of signals in the electric circuit shown in FIG. 11.
Figure 13:
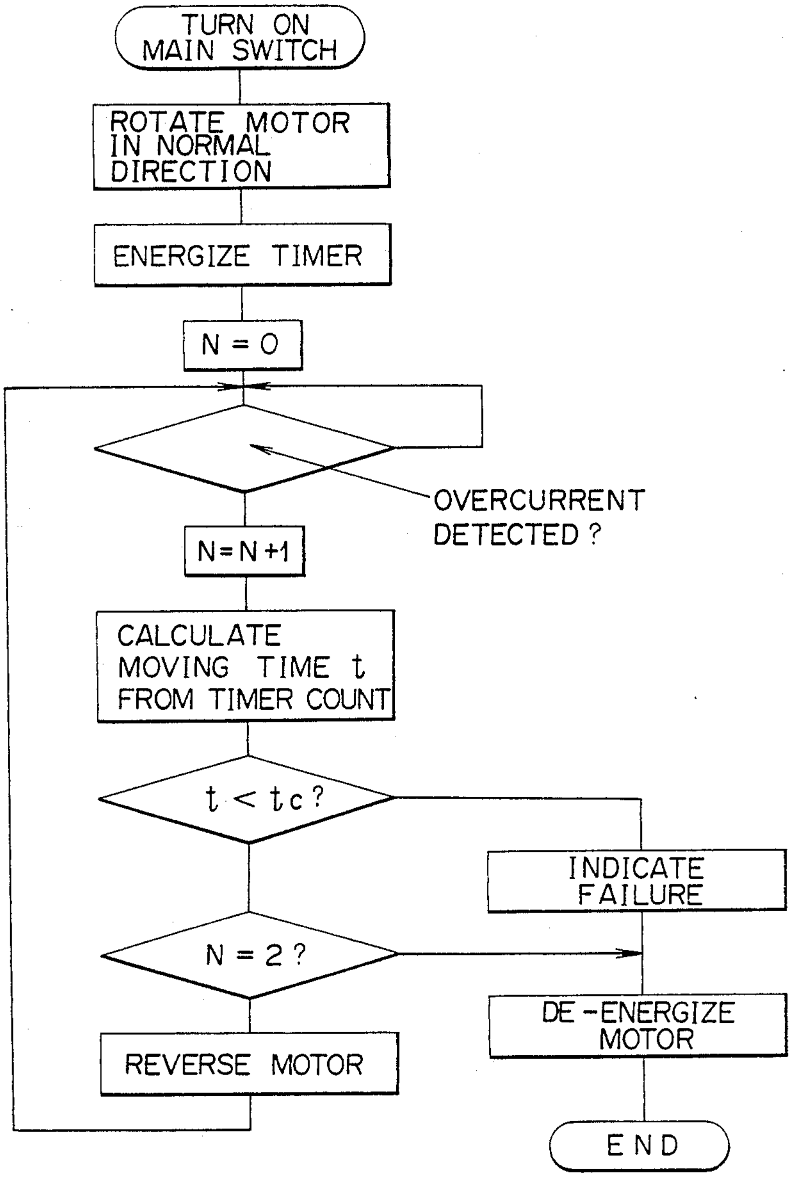
FIG. 13 is a flowchart of a process sequence of a CPU in the electric circuit of FIG. 11.

FIG. 11 shows an electric circuit of the wire cleaning device, and FIG. 12 is a timing chart of signals in the circuit. The electric circuit includes a relay 41 having contacts 42, 43 for changing the direction of rotation of the motor 21, a diode 44, a transistor 46 for turning on and off the relay 41, resistors 46, 47, a resistor 48 for detecting a current flowing through the motor 21, a transistor 49 for turning on and off the motor 21, resistors 50, 51, a resistor 52 and a capacitor 53 which jointly constitute a low-pass filter 54, an operational amplifier 55, resistors 56, 57, 58, operational amplifiers 59, 60, diodes 61, 62, a capacitor 63, resistors 64, 65, 66, the components 59 through 66 jointly serving as a peak-hold circuit 67, an analog-to-digital (A/D) converter 68, a microcomputer (CPU) 69, a nonvolatile random-access memory (RAM) 70 connected to the CPU 69, a comparator 71, resistors 72, 73, 74, 75, a capacitor 76, a transistor 77, resistors 78, 79, the components 77 through 79 jointly making up a reset circuit, and a failure indicator 80 for indicating the locking of the cleaning means 26 in its moving stroke. Since the nonvolatile RAM 70 is employed to store data, no data will be lost when the power supply is interrupted.

Now, the CPU 69 produces a high-level output signal from an output port PA1 thereof to turn on the transistor 49 and also produces a low-level output signal from an output port PA2 thereof to turn off the transistor 45 to keep the relay 41 de-energized. The motor 21 is rotated in a normal direction to move the cleaning means 26 from the home position toward the other end of the charging wires 16, 17. The current flowing through the motor 21 is detected by the resistor 48, and the voltage produced across the resistor 48 is applied through the low-pass filter 5 to the operational amplifier 55 which then amplifies the voltage in a noninverted manner. An output signal a from the operational amplifier 55, shown in FIG. 12 is applied to the peak-hold circuit 67 to charge the capacitor 63, whereupon the maximum voltage of the applied signal is detected and held. An output signal b from the peak-hold circuit 67 is converted by the A/D converter 68 into a digital signal which is then applied to the CPU 69. The output signal a from the operational amplifier 55 is also compared with a reference voltage d from the resistors 74, 75 and the capacitor 76 by the comparator 71. When the cleaning means 26 is stopped by engaging the end block 1 at the other end of the charging wires 16, 17, an overcurrent flows through the motor 21, and the output signal a from the operational amplifier 55 becomes higher than the reference voltage d as shown in FIG. 12, whereupon the output signal c from the comparator 71 goes from a low level to a high level. The CPU 69 checks the output signal c applied from the comparator 71 to an input port PB0 thereof. Upon detection by the CPU 69 of the high level of the output signal c from the comparator 71, the CPU 69 detects that the cleaning means 26 has reached the other end of the charging wires 16, 17 and the overcurrent has flowed through the motor 21. Then, the CPU 69 produces a high-level output signal from the output port PA2 to turn on the transistor 45 to energize the relay 41. The contacts 42, 43 of the relay 41 are shifted over to reverse the direction of rotation of the motor 21, thus causing the cleaning means 26 to start moving back to the home position. The CPU 69 also issues a pulse from an output port A0 thereof to render the transistor 77 conductive to discharge the capacitor 63 for thereby resetting the peak-hold circuit 67. Thereafter, when the cleaning means 26 arrives at the home position and an overcurrent flows through the motor 21, the CPU 69 detects the overcurrent by detecting a high-level output signal from the comparator 71, and then issues a low-level output signal from the output port PA1 to render the transistor 49 non-conductive. Therefore, the motor 21 is de-energized to hold the cleaning means 26 in the home position, thus finishing one cycle of cleaning of the charging wires 16, 17. The CPU 69 applies a pulse from the output port PA0 to turn on the transistor 77 to discharge the capacitor 63 for resetting the peak-hold circuit 67.

FIG. 10 shows a process sequence of the CPU 69.

When the main switch of the copying machine or the like, the CPU 69 produces a high-level output signal from the output port PA1 to rotate the motor 21 in a normal direction, and a timer is energized to count time for measuring the time in which the cleaning means 26 is moved (i.e., the position to which the cleaning means 26 is moved). Then, the CPU 69 resets a counter N indicating how many times the cleaning means 26 has moved, to 0, and checks whether an overcurrent has flowed through the motor 21 from an output signal c from the comparator 71. The step of detecting an overcurrent is repeated until an overcurrent is actually detected. When it is detected that an overcurrent flows through the motor 21, the CPU 69 increments the counter N, and calculates a time t in which the cleaning means 26 has moved by determining the difference between the time counted by the timer and a time at which the cleaning means 26 has started moving. Then, the CPU 69 compares the time t with a predetermined reference time tc. If the cleaning means 26 operates normally, the time t should fall within a certain period of time. However, if the cleaning means 26 is locked somewhere upon movement between the home position and the other end of the charging wires 16, 17, the time t is shorter than the certain period of time. The reference time tc is selected to be slightly shorter than a period of time in which the cleaning means 26 normally moves between the home position and the other end of the charging wires 16, 17 (i.e., shorter than a lower limit of the above certain period of time). Therefore, if the cleaning means 26 operates normally, then the relationship $t<tc$ is not reached, and the CPU 69 checks whether the counter N is 2 or not. If the counter N is 1, then the CPU 69 assumes that the cleaning means 26 has completed its stroke of movement toward the other end of the charging wires 16, 17, and issues a high-level output signal from the output port PA2 to reverse the motor 21. At the same time, the CPU 69 issues a pulse from the output port PA0 to reset the peakhold circuit 67, after which the CPU 69 executes the step of detecting whether an overcurrent flows through the motor 21. If the cleaning means 26 is locked in the charging area and, as a result, $t<tc$, then the CPU 69 energizes the failure indicator 80 to indicate that the cleaning means 26 is locked. The CPU 69 issues a low-level output signal from the output port PA1 to de-energize the motor 21. When the operator sees the failure indication on the failure indicator 80, the operator calls a serviceman. Upon movement of the cleaning means 26 form the other end of the charging wires 16, 17 to the home position, the CPU 69 checks whether an overcurrent flows through the motor 21 from the output signal c of the comparator 71. When an overcurrent is detected, the CPU 69 increments the counter N to calculate a time t in which the cleaning means 26 has moved by determining the difference between the time counted by the timer and a time at which the cleaning means 26 has started moving. Then, the CPU 69 compares the time t with the reference time tc. If the cleaning means 26 operates normally, and the relationship $t<tc$ is not reached, then the CPU 69 checks whether the counter N is 2 or not. If the counter N is 2, then the CPU 69 assumes that the cleaning means 26 has completed its returning stroke, and issues a high-level output signal from the output port PA1 to de-energize the motor 21. At the same time, the CPU 69 issues a pulse from the output port PA0 to reset the peak-hold circuit 67. If the cleaning means 26 is locked in the charging area and, as a result, t<tc, then the CPU 69 energizes the failure indicator 80 to indicate that the cleaning means 26 is locked. The CPU 69 issues a low-level output signal from the output port PA1 to de-energize the motor 21.

According to the arrangement of FIGS. 5 through 10, it is possible to detect whether the cleaning means is locked in its stroke of movement for preventing an improper or abnormal image from being produced by the copying machine or the like.

Figure 14:
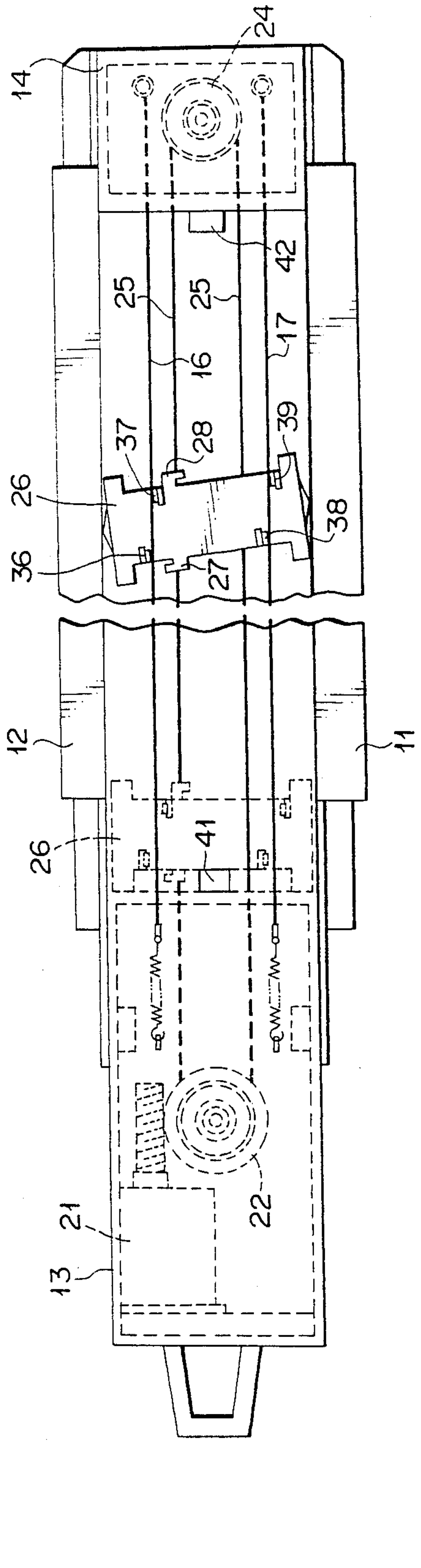
FIG. 14 is a fragmentary bottom view of a mechanism of the wire cleaning device according to the third embodiment.

FIG. 14 illustrates a mechanism of the wire cleaning device according to the third embodiment of the present invention. The illustrated mechanism is substantially the same as the mechanism shown in FIGS. 5 through 10. Those parts in FIG. 14 which are identical to those of FIGS. 5 through 10 are denoted by identical reference numerals.

The mechanism of FIG. 14 differs from the mechanism of FIGS. 5 through 10 in that a sensor 41 is attached to one end of the shield case for detecting the cleaning means 26 in a home position, and that another sensor 42 is attached to the other end of the shield case for detecting the cleaning means 26 which has reached another home position and engaged the end block 14.

Figure 15:
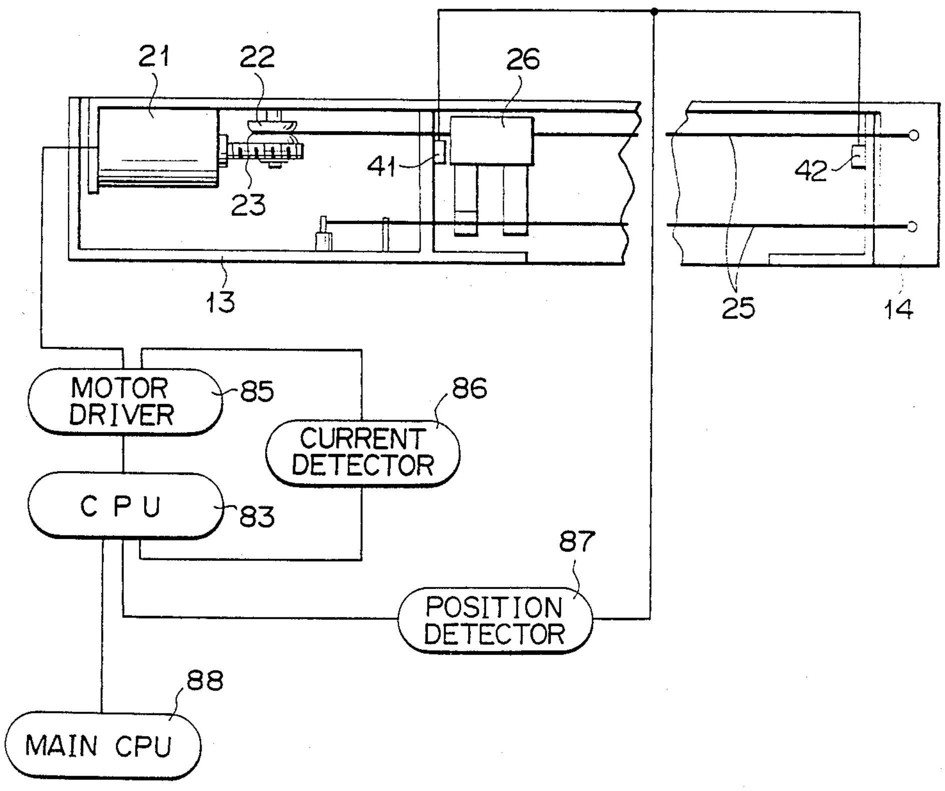
FIG. 15 is a view showing the mechanism of FIG. 15, with a block diagram of a circuit of the wire cleaning device of the third embodiment.

FIG. 15 shows a circuit associated with the mechanism shown in FIG. 14. The circuit includes a CPU (microcomputer) 83 for controlling the cleaning means 26, a motor driver 85 for driving the motor 21, a current detector 86 for detecting a current flowing through the motor 21, a position detector 87 for detecting whether the cleaning means 26 is in a home position based on a detected signal from the sensors 41, 42, and a main CPU 88 for controlling the copying machine itself.

Figure 16:
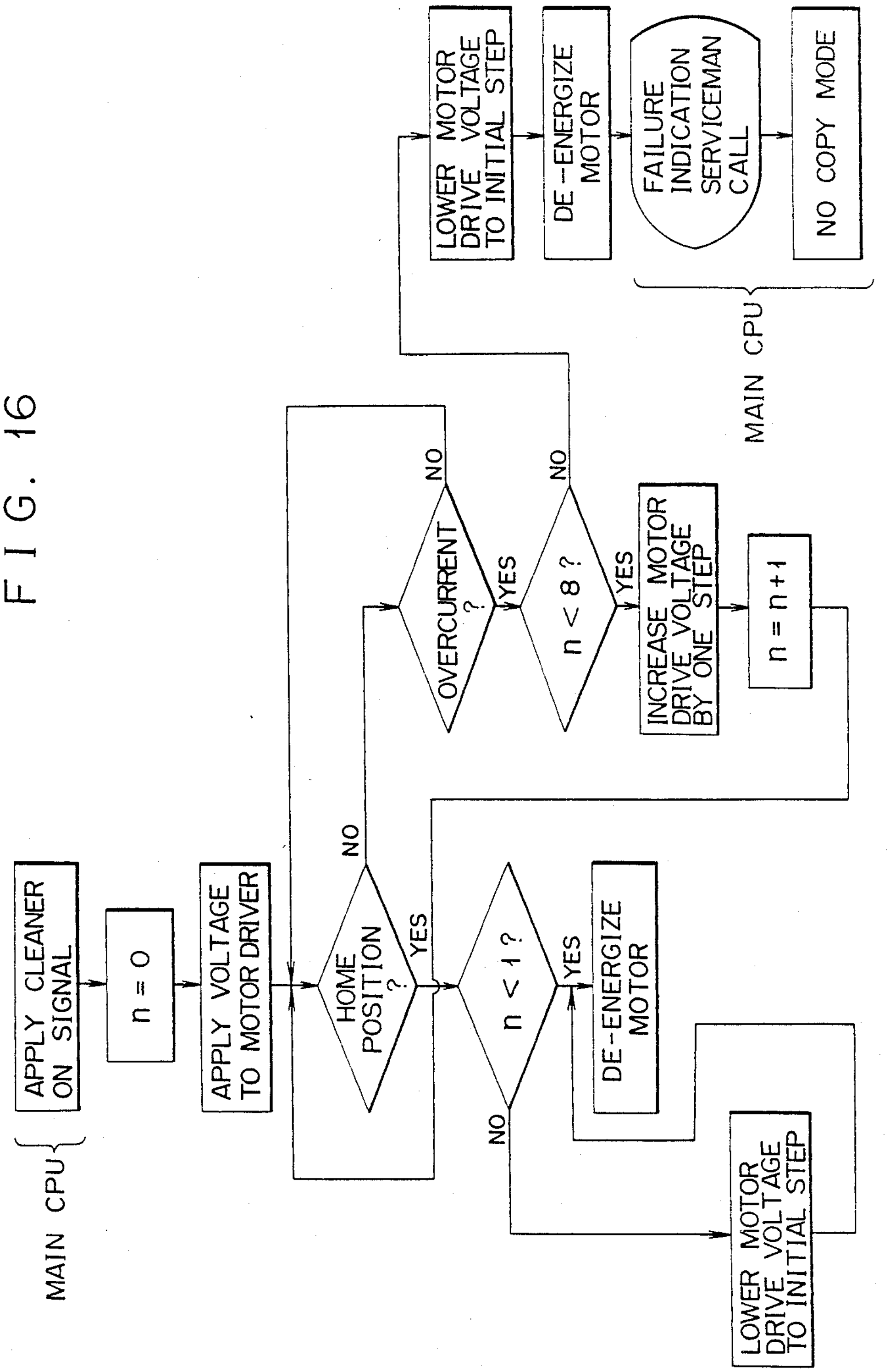
FIG. 16 is a flowchart of a process sequence of a CPU in the circuit of FIG. 15.

FIG. 16 shows a process sequence of the CPU 83 and a part of a process sequence of the main CPU 88.

With the arrangement of FIG. 16, when a certain condition is reached in the copying machine, the main CPU 88 issues a signal to operate the cleaning means control CPU 83. In the event that no copying process is carried out by the copying machine, the cleaning means 26 is located and readied in a home position detected by any one of the sensors 41, 42. If any of the sensors 41, 42 is unable to detect the cleaning means 26, then it is determined that the cleaning means 26 is stopped somewhere in its moving stroke, and the operation sequence of FIG. 16 is executed. More specifically, when a signal is applied from the main CPU 88 to the cleaning means control CPU 83 after the main switch of the copying machine has been turned on, the CPU 83 first clears a counter n, and enables the motor driver 85 to apply a voltage to the motor 21. The motor 21 is energized to move the cleaning means 26 from a home position to clean the charging wires 16, 17. About 2 seconds after the voltage has been applied to energize the motor 21 (i.e., after the cleaning means 26 has reached a stable operation region), the CPU 83 determines whether the cleaning means 26 is in a home position based on signals supplied from the sensors 41, 42 via the position detector 87. If the cleaning means 26 is not in a home position, then the CPU 83 determines whether an overcurrent flows through the motor 21 from an output signal of the current detector 86 for thereby determining whether the cleaning means 26 is locked in its stroke. If no overcurrent flows through the motor 21, then the CPU 83 continuously applies the voltage to keep the motor 21 energized. Where the initial voltage is applied to the motor 21, the motor 21 is energized until the cleaning means 26 is detected by either one of the sensors 41, 42. When the cleaning means 26 reaches a home position and is detected by one of the sensors, the CPU 83 checks the counter 0. Since the counter n is 0, the CPU 83 controls the motor driver 85 to de-energize the motor 21 for thereby holding the cleaning means 26 in the home position.

Where the initial voltage is not continuously applied to the motor 21 until the cleaning means 26 reaches a home position, i.e., in the event that an overcurrent flows through the motor 21 before the cleaning means 26 reaches a home position, the CPU 83 assumes that the cleaning means 26 is locked somewhere in its stroke, and checks the counter n. Inasmuch as the counter n is 0, the CPU 83 controls the motor driver 86 to increase the motor drive voltage 1.2 times, so that a larger amount of energy is applied to the motor 21. Most of locked conditions of the cleaning means 26 caused by small loads thereon can be canceled by the application of such a larger amount of energy.

The large energy to be applied to the motor 21 is available in eight steps or increments. The CPU 38 checks, in every 2 seconds, whether the cleaning means 26 is in a home position and whether an overcurrent flows through the motor 21. If the cleaning means 26 is not in a home position and if an overcurrent flows through the motor 21, then the CPU 83 controls the motor driver 85 increments the motor drive voltage by one step and counts up the counter n. The upper limit for the drive voltage for the motor 21 is selected to be 1.6 times a normal voltage because the motor 21 should be unlocked at as low a load as possible. Overcurrents for the motor 21 are selected in the respective steps. When the current detector 86 detects a current which is about 2 times or more a normal current in each of the steps, the CPU 83 regards that current as an overcurrent. For example, the overcurrents in the respective steps are selected as follows:

| Step | Detected Current |
|---|---|
| Step 0 | 580 mA |
| Step 1 | 680 mA |
| Step 2 | 800 mA |
| Step 3 | 960 mA |
| Step 4 | 1140 mA |
| Step 5 | 1360 mA |
| Step 6 | 1600 mA |
| Step 7 | 1900 mA |
| Step 8 | 2200 mA |

If the cleaning means 26 is operated before the drive voltage for the motor 21 reaches the upper limit thereof, the drive voltage remains as it is and the cleaning means 26 continues to operate. When the cleaning means 26 is detected in a home position by either the sensor 41 or 42, the CPU 83 checks the counter n. Since the counter n is not 0, the CPU 83 controls the motor driver 85 to bring the drive voltage for the motor 21 back to the initial drive voltage, and de-energizes the motor 21. Then, the CPU 83 sends a signal to the main CPU 88 to carry out a copying process. If the cleaning means 26 is stopped again before reaching a home position, then the CPU 83 controls the motor driver 85 to increment the drive voltage for the motor 21 one step at a time for thereby applying a larger amount of energy to the motor 21. When the cleaning means 26 is operated again, then the same process as above is followed. The upper limit for the motor drive voltage at this time is 1.6 times the normal drive voltage.

In the event of an operation failure of the cleaning means 26 even if the drive voltage for the motor 21 has been increased 1.6 times the normal drive voltage, the motor 21 might possibly be heated. Therefore, the CPU 83 controls the motor driver 85 to reduce the drive voltage for the motor 21 back to the initial voltage to turn off the motor 21, and delivers a failure signal to the main CPU 88. In response to the received failure signal, the main CPU 88 energizes a failure indicator to indicate a serviceman call, and activates a no copy mode to inhibit a copying process.

With the above arrangement, when the cleaning means is locked, a larger amount of energy than normal is applied to the motor for forcibly moving the cleaning means. Therefore, unwanted stoppage or locking of the cleaning means somewhere in its moving stroke due to a small amount of smear or dirt thereon can automatical canceled, for thereby preventing the reproduction of an improper image or the occurrence of a sheet jam which would otherwise be caused by such unwanted stoppage of the cleaning means, and also preventing the efficiency of image forming operation in an image forming device.

Figure 17:
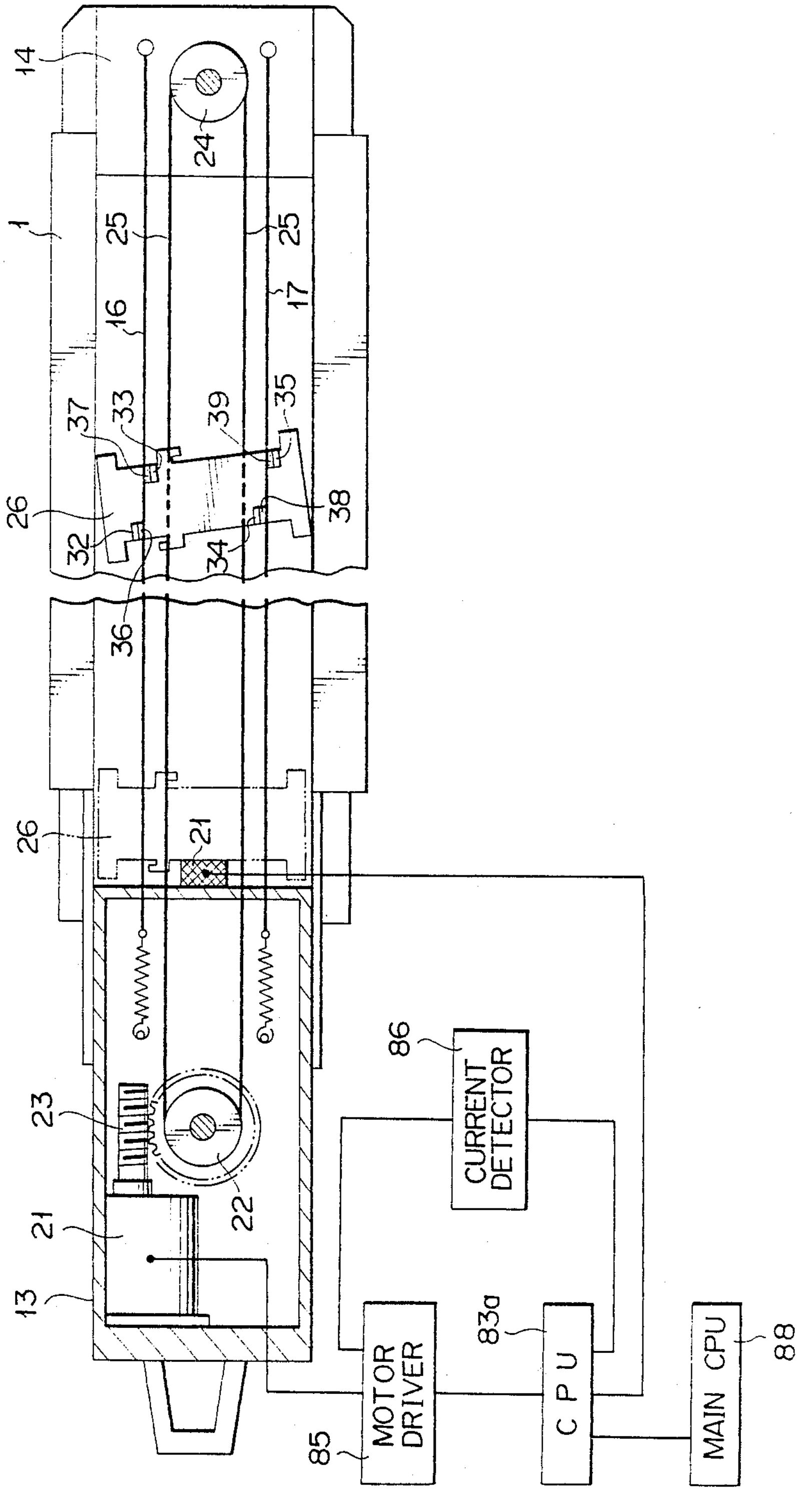
FIG. 17 is a bottom view, partly in block form, of a mechanism of the wire cleaning device according to the fourth embodiment.

FIG. 17 shows a mechanism of the wire cleaning device according to the fourth embodiment of the present invention. Those components shown in FIG. 17 which are identical to those of FIG. 14 are denoted by identical reference numerals. The wire cleaning device of FIG. 17 includes a home position sensor 41, but does not have a home position sensor equivalent to the sensor 42 shown in FIG. 14. An electric circuit associated with the mechanism has no position detector and includes a cleaning means control CPU 83a which executes a process sequence as shown in FIG. 18.

Figure 18:
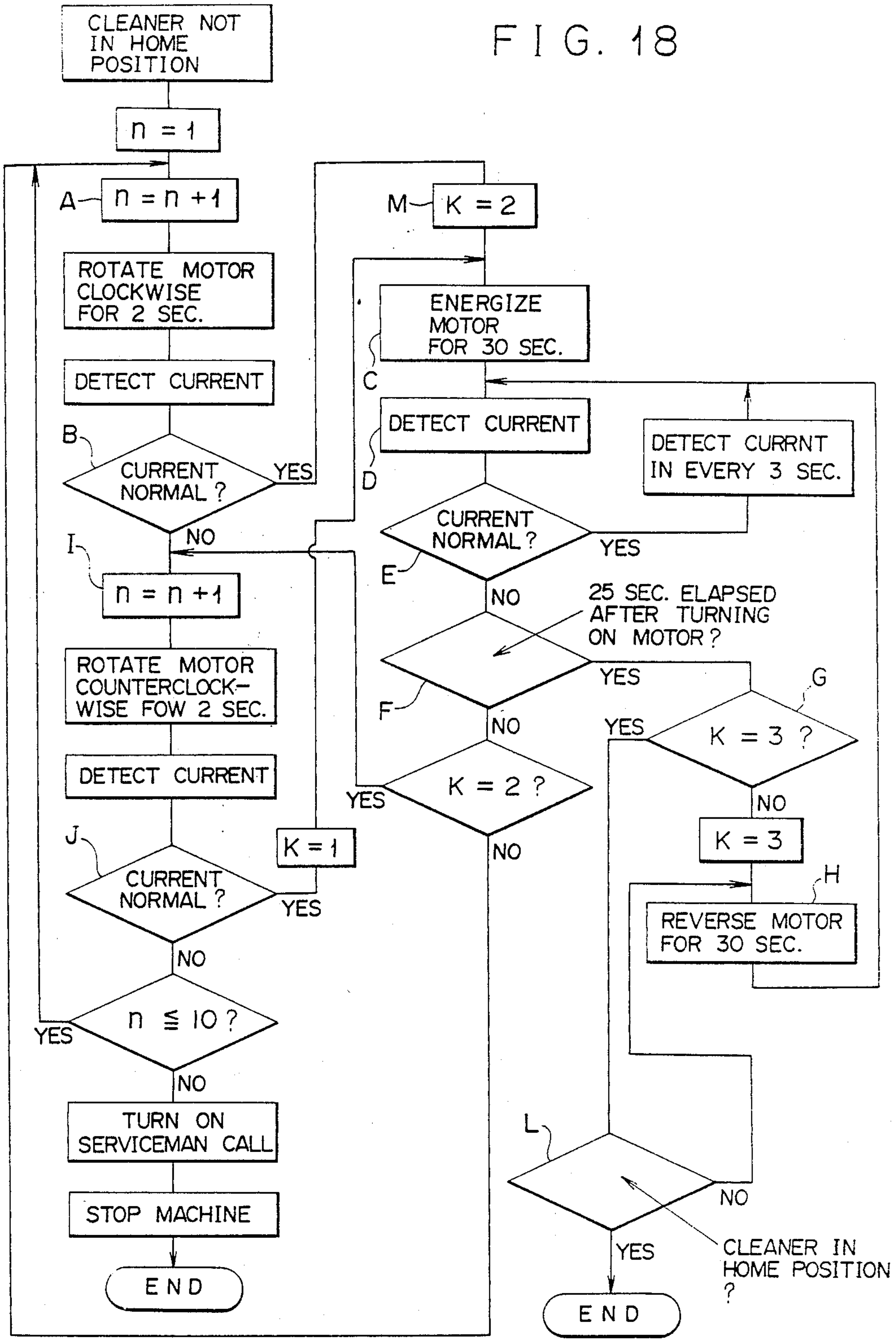
FIG. 18 is a flowchart of a process sequence of a CPU shown in FIG. 17.

As illustrated in FIG. 18, during normal operation, the cleaning means control CPU 83a controls the motor driver 85 to rotate the motor 21 clockwise for moving the cleaning means 26 from the home position, and sets the counter n to 1. Then, the CPU 83a increments the counter n in a step A, and controls the motor driver 85 to rotate the motor 21 clockwise for 2 seconds. The CPU 83a reaches an average current flowing through the motor 21, and determines whether the current is of a normal value or not in a step B. The CPU 83a has established 60 mA as a limit value for such an average motor current. If the detected average current is in excess of 60 mA, then the CPU 83a determines that the motor current is abnormal, and if the detected motor current is below 60 mA, then the CPU 83a determines that the motor current is normal. During normal operation, the average current flowing through the motor 21 is 30 mA, and then the CPU 83a sets K=2 in a step M , and controls the motor driver 85 to continuously rotate the motor 21 for 30 seconds. The CPU 83a reads the average current flowing through the motor 21, which has been detected by the current detector 86, in a step D, and determines whether the detected average current is of the normal value or not in a step E. If the average current is normal, then the CPU 83a repeatedly detects the average current detected by the current detector 86 in every 3 seconds, and determines whether the detected current is of the normal value or not. If the cleaning means 26 reaches the end of the charging wires 16, 17 and a current higher than normal passes through the motor 21, then the CPU 83a determines whether 25 seconds or more have elapsed after the motor 21 started rotating in a step F. The cleaning means 26 can clean the entire length of the charging wires 16, 17 within 25 seconds in each of its forward and backward strokes. Since 25 seconds or more have elapsed from the start of rotation of the motor 21 in normal operation, the CPU 83a determines whether K is 3 or not in a step G. Inasmuch as K is 2, the CPU 83a sets K=3 and then controls the motor driver 85 to rotate the motor 21 counterclockwise for 30 seconds to return the cleaning means 26 in a step H. Thereafter, control goes back to the step D, and repeatedly detects the average current detected by the current detector 86 in every 3 seconds, and determines whether the detected current is of the normal value or not. If the cleaning means 26 returns to the home position and a larger current than normal passes through the motor 21, then the CPU 83a determines whether 25 seconds or more have elapsed from the start of rotation of the motor 21. Since 25 seconds or more have elapsed after the motor 21 started rotating counterclockwise in normal operation, the CPU 83a determines whether K is 3 or not in the step G. Because K is 3 at this time, the CPU 83a checks a signal from the home position sensor 41 to determine the cleaning means 26 is in the home position or not in a step L. If the cleaning means 26 is in the home position, then one cycle of cleaning operation is completed.

In the event that the cleaning means 26 does not operate normally, e.g., if the cleaning means 26 is locked on the charging wires 16, 17 when the motor 21 is rotated clockwise for 2 seconds, and the current flowing through the motor 21 is determined to be higher than normal in the step B, then the CPU 83a increments the counter n in a step I to control the motor driver 85 to rotate the motor 21 counter-clockwise for 2 seconds. Then, the CPU 83a reads an average current flowing through the motor 21 as detected by the current detector 86, and determines whether the detected current is of the normal value or not in a step J. If the detected average current is not normal, then the CPU 83a returns to the step A if the counter 10 is equal to or below 10. Therefore, the motor 21 is rotated alternately clockwise and counterclockwise in every 2 seconds to impart vibration to the cleaning means 26. If the average current flowing through the motor 21 does not reach the normal value even when the counter n reaches 10, then the CPU 83a energizes the non-illustrated indicator to indicate a serviceman call and shut off the copying machine. If the cleaning means 26 is unlocked by the applied vibration and the average current flowing through the motor 21 becomes normal, then control goes from the step B to the step M to drive the motor 21 normally when the motor 21 is rotated clockwise, or control goes from the step J to the step C after setting K=1, to drive the motor 21 normally.

If the cleaning means 26 is locked on the charging wires 16, 17 and 25 seconds or more have not elapsed from the start of rotation of the motor 21 in the step F, then the CPU 83a checks whether K is 2 or not (i.e., whether the motor 21 is rotated clockwise or not). If K=2, then control goes to the step I, and if K≠2, then control goes to the step A to cause the motor 21 to rotate alternately clockwise and counterclockwise in every 2 seconds for thereby vibrating the cleaning means 26. If the cleaning means 26 is not in the home position in a step L, control goes to the step H.

With the arrangement of FIGS. 17 and 18, since the cleaning means when locked is vibrated, unwanted stoppage or locking of the cleaning means somewhere in its moving stroke due to a small amount of smear or dirt thereon can automatically canceled, for thereby preventing the reproduction of an improper image or the occurrence of a sheet jam which would otherwise be caused by such unwanted stoppage of the cleaning means, and also preventing the efficiency of image forming operation in an image forming device.

Although certain preferred embodiments have been shown and described, it should be understood that many changes and modifications ma be made therein without departing from the scope of the appended claims.

What is claimed is:

1. A wire cleaning device comprising cleaning means movable for cleaning a charging wire in a corona discharger, a motor for moving the cleaning means, position detecting means for detecting the position of the cleaning means, failure detecting means for detecting a movement failure of the cleaning means, and lock determining means for determining whether the cleaning means is locked in a moving stroke thereof based on information detected by the failure detecting means and the position detecting means.

2. A wire cleaning device comprising cleaning means movable for cleaning a charging wire in a corona discharger, a motor for moving the cleaning means, overcurrent detecting means for detecting an overcurrent flowing through the motor, timer means for starting to count time simultaneously with starting of movement of the cleaning means, and lock determining means for determining whether the cleaning means is locked in a moving stroke thereof from the time counted by the timer means when an overcurrent is detected by the overcurrent detecting means.

3. A wire cleaning device for use in an image forming device having a corona discharger for recording an image, comprising cleaning means for cleaning a charging wire in the corona discharger, a motor for moving the cleaning means, a sensor for detecting the cleaning means at each of opposite ends of the charging wire, failure detecting means responsive to a detected signal from the sensor for detecting stoppage of the cleaning means in a moving stroke thereof, and control means responsive to failure detection by the failure detecting means for increasing the amount of energy to the motor to forcibly move the cleaning means.

4. A wire cleaning device comprising cleaning means movable for cleaning a charging wire in a corona discharger, a motor for moving the cleaning means, a home position sensor for detecting the cleaning means in a home position at one end of the charging wire, failure detecting means responsive to a detected signal from the home sensor for detecting a movement failure of the cleaning means, and vibration generating means responsive to failure detection by the failure detecting means for imparting vibration to the cleaning means.

* * * * *